United States Patent
Yang et al.

[11] Patent Number: 5,760,479
[45] Date of Patent: Jun. 2, 1998

[54] FLIP-CHIP DIE ATTACHMENT FOR A HIGH TEMPERATURE DIE TO SUBSTRATE BOND

[75] Inventors: Jau-Yuann Yang, Richardson; Han-Tzong Yuan, Dallas, both of Tex.

[73] Assignee: Texas Instruments Incorporated, Dallas, Tex.

[21] Appl. No.: 808,373

[22] Filed: Feb. 28, 1997

[51] Int. Cl.⁶ .............. H01L 23/48; H01L 23/52; H01L 29/40
[52] U.S. Cl. .............. 257/778; 257/751; 257/764; 257/736
[58] Field of Search .............. 257/778, 736, 257/751, 750, 763, 764, 773, 777, 781, 784; 438/350, 683, 648, 752, 761, 686

[56] References Cited

U.S. PATENT DOCUMENTS

| | | | |
|---|---|---|---|
| 4,978,052 | 12/1990 | Fister et al. | 228/123 |
| 5,070,036 | 12/1991 | Stevens | 257/760 |
| 5,173,449 | 12/1992 | Lorenzen et al. | 257/758 |
| 5,235,140 | 8/1993 | Reele et al. | 174/267 |
| 5,237,130 | 8/1993 | Kulesza et al. | 174/260 |
| 5,293,071 | 3/1994 | Erdos | 257/737 |
| 5,346,857 | 9/1994 | Scharr et al. | 437/183 |
| 5,359,768 | 11/1994 | Haley | 29/840 |
| 5,370,301 | 12/1994 | Belcher et al. | 228/180.22 |
| 5,435,734 | 7/1995 | Chow | 439/69 |
| 5,438,477 | 8/1995 | Pasch | 361/689 |
| 5,448,114 | 9/1995 | Kondoh et al. | 257/778 |
| 5,578,874 | 11/1996 | Kurogi et al. | 257/778 |
| 5,656,857 | 8/1997 | Kishita | 257/690 |

*Primary Examiner*—Mahshid D. Saadat
*Assistant Examiner*—Jhihan B. Clark
*Attorney, Agent, or Firm*—Bret J. Petersen; James C. Kesterson; Richard L. Donaldson

[57] ABSTRACT

A method and structure is given for flip-chip mounting an integrated circuit on a substrate. An embodiment of the present invention is a GaAs die flip-chip 14 mounted to a silicon semiconductor 10 which has additional processing circuitry. The flip-chip bond uses an alloy metal film, preferably a thin film of AuGe 38, 40. The invention gives a high temperature bond which is suitable for subsequent high temperature processes to be performed on the flip-chip mounted combination. The bond may also include a diffusion barrier 36 which provides a short circuit free LED contact. A preferred embodiment introduces a microchip chemical sensor by integrating a GaAs LED 14 with a polyimide waveguide 56 and a silicon photosensor 16 on the same chip.

15 Claims, 1 Drawing Sheet

FLIP-CHIP DIE ATTACHMENT FOR A HIGH TEMPERATURE DIE TO SUBSTRATE BOND

This application claims priority under 35 U.S.C. §119(e)(1) of provisional application number 60/012,528, filed Feb. 29, 1996.

The following concurrently filed application is related to the instant application and is incorporated herein by reference. Ser. No. 08/808,373 AN INTEGRATED MICROCHIP CHEMICAL SENSOR.

FIELD OF THE INVENTION

This invention generally relates to methods for connecting an integrated circuit to another integrated circuit or substrate. In particular, it describes a structure and method of mounting a semiconductor die such as GaAs to a substrate such as silicon. A preferred embodiment is described in connection with a GaAs LED mounted to a silicon substrate to implement a refractive index type chemical sensor, which uses optical waveguides integrated on a microchip substrate, for sensing properties in an environment.

BACKGROUND OF THE INVENTION

Integrated circuits are typically fabricated by processing a number of circuits on a thin slice or wafer of semiconductor crystal such as gallium arsenide or silicon. After the processing of the circuits is completed, the wafer is separated into individual dice or chips. Thus, each die is a leadless monolithic structure or alternatively, a small piece of semiconductor with some circuitry fabricated on the top face of the semiconductor usually referred to as the substrate. This small chip of silicon or die is often packaged in a chip carrier such as those commonly seen mounted to printed wiring boards or circuit boards.

A flip-chip is a die as discussed above that contains circuit elements which is designed to electrically and mechanically connect directly to a circuit board or other substrate. Flip-chip mounting is concerned with mounting a die directly to a printed wiring board or substrate, top or active side down. The bond is usually made with solder bumps on the circuit board which correspond to electrical bonding pads on the die.

The most common use of flip-chip mounting is for mounting a chip to a printed circuit board or some other substrate to form a hybrid circuit. The primary reason for such mounting is to reduce the size of the circuit and eliminate wire connections typically made from the die to the chip carrier. Occasionally, as with the illustrative embodiment of the present invention, a die is flip-chip mounted to a substrate which is also a slice of semiconductor that may also have printed circuits thereon. A common reason for this combination is to allow an integration of GaAs die with a silicon integrated circuit.

The embodiment of the present invention is directed to an integrated micro-chip chemical sensor for a device to sense the changing of a property in an environment. In the art, devices have been demonstrated that can detect the presence of chemical or a property of an environment by detecting a change in the index of refraction of an optical waveguide. Many of these sensors are based on optical fibers, which guide light through the core of a fiber by total internal reflection at the core/cladding interface using a cladding of lower refractive index than the core. Others are based on a waveguide core on a semiconductor substrate. In either case, these chemical sensors typically use the principle that some materials exhibit a change in index of refraction when exposed to a substance or change in the environment. Therefore, a change in the environment can be detected by monitoring changes in the light signal traveling in the waveguide caused by the change in the index of refraction.

SUMMARY OF THE INVENTION

In accordance with the present invention, a method and structure is given for flip-chip mounting an integrated circuit on a substrate. An embodiment of the present invention is a GaAs die flip-chip mounted to a silicon semiconductor which has additional processing circuitry. An advantage of the present invention is the ability to take advantage of GaAs optical source structures in combination with silicon photodetectors and integrated circuits.

An additional advantage of the present invention is a high temperature bond such that further processing may be done after flip-chip mounting. In the prior art, flip-chip mounting was done with various forms of solder bonding. Since the solder will reflow at a fairly low temperature, flip-chip mounting according to the prior art is limited to applications where subsequent processing requires only temperatures below the melting point of the solder used. An embodiment of the present invention, a chemical sensor using a LED mounted to a silicon IC, requires curing a polyamide waveguide material at a temperature above the melting point of solder, therefore the prior art structures and processes would be ineffective in this application.

Novel features and advantages of the present invention also include an AuGe thin film for flip chip die attachment which is suitable for subsequent high temperature polyamide curing process without degrading Si devices, and a TiW diffusion barrier which provides a short circuit free LED contact.

Another advantage is the AuGe layer self-aligned to the LED edge which minimizes the reflow and light scattering problem.

An embodiment of the invention is an integrated microchip chemical sensor to sense the presence of a property in an environment. The sensor uses a GaAs LED mounted to a silicon substrate having a waveguide coated with a sensitive material and a silicon PIN photosensor integrated in a single package. The light is emitted at the edge of the GaAs LED. At the air/polyimide interface, some of the emitted light transmits through the interface and some of the light reflects back and is detected by a PIN diode. This process continues until the light intensity fades away. A chemical sensitive material is coated on the air/polyimide interface so the light transmitted from the polyimide to air increases when the gas to which the material is sensitive appears, thus the total light sensed by the photodetector decreases which indicates chemical detection.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiment of the present invention is best understood by referring to FIGS. 1-6 of the drawings, like numerals are used for like and corresponding parts of the various drawings.

Figure 1:
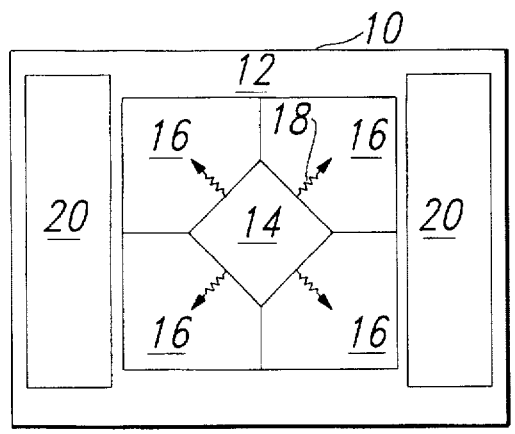
FIG. 1 Shows a plan view of an embodiment of the present invention.

With reference to FIG. 1, a plan view of an embodiment of the present invention, where an integrated smart sensor 10 is shown. The integrated smart sensor, shown generally at 10, is fabricated on a semiconductor substrate 12. The sensor 10 includes a LED 14 disposed amid four PIN diodes 16 as shown. The LED 14 is a double heterojunction GaAs LED which is flip chip mounted to the semiconductor substrate 12. The emitted light signal 18 travels in a dielectric waveguide on the surface of the PIN diodes. The light signal is detected by PIN diodes 16 as influenced by the chemical to be detected. The detected signal may be processed and analyzed by conditioning and processing circuitry 20.

Figure 2:
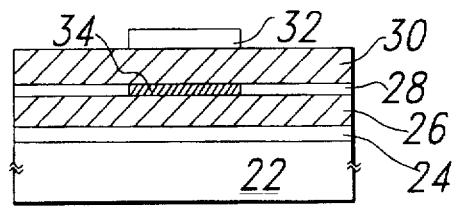
FIGS. 2–5 Represents the process flow for flip-chip mounting a GaAs LED on a silicon semiconductor for an embodiment of the present invention.

FIG. 2 represents a cross sectional side view of the LED 14 shown in FIG. 1. In a preferred embodiment, a GaAs LED is to be flip-chip mounted to the silicon semiconductor substrate. The LED is preferably a double heterojunction GaAs structure. A GaAs double heterojunction LED epitaxy is preferably grown by Metal Organic Vapor Phase Epitaxy (MOVEP) on a GaAs n+ substrate 22. A GaAs double heterojunction structure can be fabricated as known by one in the art. In a preferred embodiment, layers are grown on a GaAs n-type substrate. First a layer of GaAs n-type 24 is grown, followed by AlGaAs n-type 26 followed by an active layer of GaAs p-type 28. On the active layer a layer of AlGaAs p-type 30 is grown followed by a cap layer of GaAs p-type 32. The double heterojunction AlGaAs/GaAs/AlGaAs structure provides higher emission efficiency for LEDs. An active device area 34 is defined by mesa etching the P+ cap layer, which confines the current flow only underneath the p+ cap region and defined the light emitting area as shown in shaded dark region 34 of FIG. 2. It may be desirable to limit the light emitting area to produce a point source of light rather than emitting light from the entire side of the mesa. Reducing the emitting area will typically also reduce the current required to drive the LED.

Figure 3:
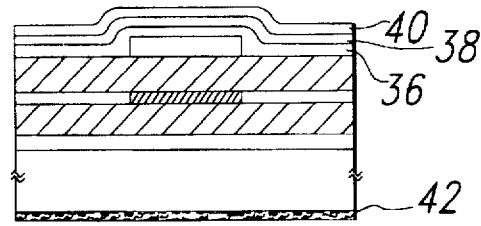

In preparation for flip-chip mounting, the LED cap layer 32 is followed by several layers as shown in FIG. 3. These layers form an anode contact on the GaAs p-type layer 32 shown in FIG. 3. The first layer is TiW 36 evaporated on the top of the LED cap layer to to a thickness of about 1,000 Å to 3,000 Å. This layer acts as a diffusion barrier for the subsequent AuGe alloy layer to prevent the AuGe layer from spiking through the P type GaAs and into the N type side of the LED and thereby shorting out the LED. The diffusion barrier is preferably followed by evaporation of a 1,000 Å to 10,000 Å layer of Au film 38. The Au film is followed by electron beam evaporation a 1,000 Å to 3,000 Å layer of AuGe 40. The benefit of the Au/AuGe combination is providing a bonding and conformable die attachment. The Au and Au/Ge layers are preferably diffused together by heating at 350° C. to 375° C. for 2 minutes. After the anode metal contact is formed, the backside of the LED wafer, layer 22, is preferably lapped down to decrease the thickness of the substrate 32 to about 4 mils. The n side cathode contact 42 is preferably formed on the LED by evaporating about 500 Å/500 Å/3,000 Å of AuGe/Ni/Au on the backside of the lapped wafer as shown in FIG. 3.

Figure 4:
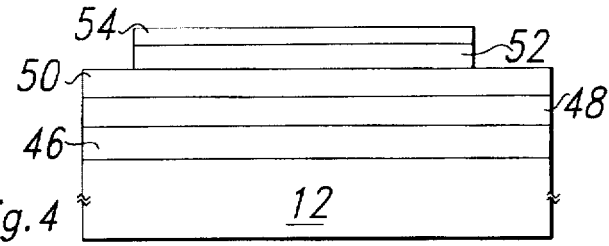
Figure 5:
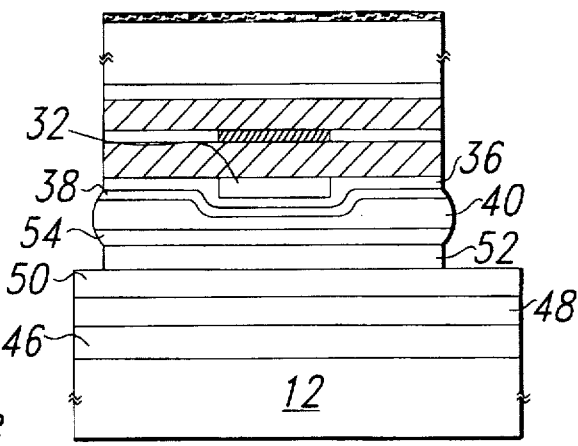

The substrate is prepared for flip-chip mounting as depicted in FIG. 4. Preferably the circuit fabrication on the silicon is completed prior to flip-chip mounting. In the illustrated embodiment, a silicon substrate 12, contains PIN diodes fabricated on the surface, where the PIN diodes include P layer 46 and N layer 48. An insulating layer 50 of $SiO_2$ covers the PIN diodes and insulates the diode contacts from the LED cathode contact.

To prepare the silicon circuit substrate for flip-chip mounting, a layer of TiW 52 metal is deposited on the silicon wafer to a thickness of about 1,000 Å to 3,000 Å. The TiW layer is followed by a layer of Au film to form an alloy pad or pads 54 for the LED to be mounted on. The TiW layer 52 is about 1,000 Å to 1,500 Å in thickness which is deposited by sputtering. The Au film 54 is sputtered on the TiW layer to a thickness of about 1,000 Å to 2,000 Å. The advantages for using this combination include the TiW acting as an adhesion layer between the Au film and the $SiO_2$. In a preferred embodiment, a layer of photoresist is deposited on the $SiO_2$ layer and the resist in the area where the alloy pad is to be fabricated is patterned and etched out. The TiW layer and then the Au film may then sputtered, adhering to the $SiO_2$ in the opening in the resist. The wafer or chip of silicon can then be treated, with acetone for example, to lift off the resist leaving the TiW 52 and Au film 54 as shown in FIG. 4.

After the LED and the substrate is prepared as discussed above, the LED is preferably flip chip mounted to a silicon substrate with PIN diodes as discussed above and shown in FIG. 5. In the preferred embodiment, a single LED die is mounted directly on top of the silicon PIN diode of the photosensor. A preferred method of mounting the die to the substrate is through the thermal compression of AuGe metal alloy compound at 372° C. The combination of compression and heat preferably will cause the alloys of the die contact and the substrate contact to flow together and mix. This flowing of the combined metal of these layers may cause some of the metal to flow outside the mating region as represented by the bulge shown in layers 38, 40, and 54 in FIG. 5. In an alternative embodiment, the mounting of the flip-chip is by using ultrasonic reflow of the metals of the die contact. After mounting the LED a polyimide waveguide is formed as discussed below.

Figure 6:
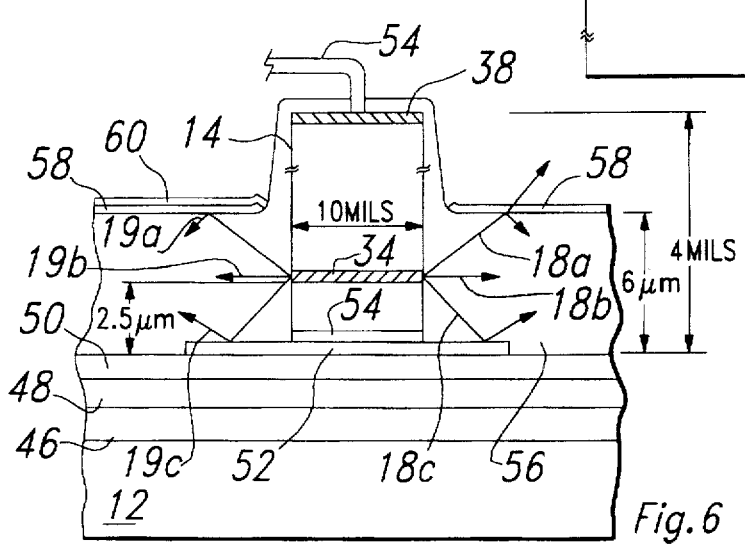
FIG. 6 Illustrates a cross section of an embodiment, an integrated sensor.

Referring to FIG. 6, the operation of the flip-chip LED is shown in the preferred embodiment sensor. The LED 14 emits light 18 from active area 34 into polyimide waveguide 56 as shown. Light is emitted at all angles between light vectors 18a and 18c. Light emitted essentially parallel to the substrate, such as that shown by light vector 18b, is wasted signal. Part of the light, indicated by vector 18b, propagates toward the air/polyimide interface. At the air/polyimide interface, some of the light transmits through the interface and some of the light reflects back and is detected by a PIN diode. This process continues until the light intensity fades away. An environmentally sensitive material 58 is coated on top of the polyimide 56. When the condition to which the material is sensitive appears, the light transmitted from the polyimide to air increases, thus the total signal sensed by the photodetector decreases which indicates chemical detection. The environmentally sensitive material 58 may be coated with a protective layer 60 on one or more LED outputs to use as a reference signal to reduce noise.

The sole Table, below, provides an overview of some embodiments and the drawings.

TABLE

| Drawing Element | Preferred or Specific Examples | Generic Term | Other Alternate Examples |
|---|---|---|---|
| 10 | Sensor | | |
| 12 | Silicon Chip | Substrate | GaAs Chip |
| 14 | GaAs LED | LED | InP, InGaAs LED (superlattice) |
| 16 | PIN Diode | Photosensor or Detector | |
| 18 | Light | Light | |
| 20 | Si Microprocessor | Processing Circuitry | Any Signal Processor |
| 22 | GaAs n+ Substrate | LED Substrate | InP, InGaAs |
| 24–32 | GaAs | LED Layers | InGaAs |
| 34 | Active Area | | |
| 36 | TiW | Diffusion Barrier | TiN |
| 38 | Au | Anode | TiW/Au |
| 40 | AuGe | Anode | |
| 42 | AuGe/Ni/Au | Cathode | Pd/In/Ge/Au |
| 46 | Si n-type 2 | Substrate Device | GaAs, InP |
| 48 | Si p-type | Substrate Device | GaAs, InP |
| 50 | $SiO_2$ | Dielectric | $Si_3N_4$ |
| 52 | TiW | | TiN |
| 54 | Au | | |
| 56 | Polyimide | Waveguide | Any Polymer Waveguide |
| 58 | Paralene | Sensitive Cladding | Any other material which causes the index of refraction change for the environment change to be sensed |
| 60 | W | Protective Layer | Any non-reactive opaque metal or material |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A flip-chip die bonding structure for an integrated hybrid circuit comprising:
   (a) a semiconductor substrate;
   (b) at least one bonding pad on said substrate comprising a barrier layer and an alloy metal layer;
   (c) a chip die having a bonding pad comprising an alloy metal layer and a barrier layer between said chip die and said alloy metal layer;
   wherein said chip die is mounted such that said alloy metal layer of said chip die is fused with said alloy layer of said substrate bonding pad, and wherein said alloy metal layer on said chip die includes metals from the group including Au, Ge and AuGe.

2. The structure according to claim 1, further comprising a barrier layer on said chip die between said chip die and said alloy metal layer of said chip die.

3. The structure according to claim 1, wherein said alloy metal layer on said substrate includes metals from the group including Au, Ge and AuGe.

4. The structure according to claim 1, wherein said alloy metal layer on said chip die includes metals from the group including Au, Ge and AuGe.

5. The structure according to claim 2, wherein said chip die is mounted to said substrate using thermal compression.

6. The structure according to claim 2, wherein said chip die is mounted to said substrate using ultrasonic bonding.

7. The structure according to claim 2, wherein said barrier layer is TiW.

8. The structure according to claim 7, wherein said alloy metal layer is self-aligned.

9. A flip-chip die bonding structure for an integrated hybrid circuit comprising:
   (a) a silicon substrate;
   (b) at least one bonding pad on said substrate comprising a barrier layer and an alloy metal layer;
   (c) a GaAs flip-chip die having a barrier layer and an alloy metal layer;
   where in said flip chip die is mounted an active side down such that said alloy metal layer of said flip-chip is fused with said alloy layer of said substrate alloy metal layer.

10. The structure according to claim 9, wherein said alloy metal layer on said substrate includes metals from the group including Au, Ge and AuGe.

11. The structure according to claim 9, wherein said barrier layer is TiW.

12. The structure according to claim 9, wherein said alloy metal layer on said flip-chip die includes metals from the group including Au, Ge and AuGe.

13. The structure according to claim 9, wherein said flip-chip die is mounted to said substrate using thermal compression.

14. The structure according to claim 9, wherein said flip-chip die is mounted to said substrate using ultrasonic bonding.

15. The structure according to claim 10, wherein said alloy metal layer is self-aligned.

* * * * *